(12) United States Patent
Lee et al.

(10) Patent No.: US 9,291,669 B2
(45) Date of Patent: Mar. 22, 2016

(54) SEMICONDUCTOR DEVICE, TEST STRUCTURE OF THE SEMICONDUCTOR DEVICE, AND METHOD OF TESTING THE SEMICONDUCTOR DEVICE

(71) Applicants: Jin-Myoung Lee, Gumi-si (KR); Il-Kwon Lee, Hwaseong-si (KR); Jun-Woo Lee, Gwacheon-si (KR); Sang-Goo Jung, Daegu (KR); Kyoung-Mi Park, Yongin-si (KR); In-Ae Lee, Seoul (KR)

(72) Inventors: Jin-Myoung Lee, Gumi-si (KR); Il-Kwon Lee, Hwaseong-si (KR); Jun-Woo Lee, Gwacheon-si (KR); Sang-Goo Jung, Daegu (KR); Kyoung-Mi Park, Yongin-si (KR); In-Ae Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/471,835

(22) Filed: Aug. 28, 2014

(65) Prior Publication Data
US 2015/0113343 A1  Apr. 23, 2015

(30) Foreign Application Priority Data
Oct. 22, 2013  (KR) .................. 10-2013-0125735

(51) Int. Cl.
*G06F 17/50* (2006.01)
*G01R 31/28* (2006.01)

(52) U.S. Cl.
CPC ................. *G01R 31/2884* (2013.01)

(58) Field of Classification Search
CPC ................. G01R 31/317; G01R 31/318536
USPC ................................... 716/112, 136
See application file for complete search history.

(56) References Cited

U.S. PATENT DOCUMENTS

| | | | |
|---|---|---|---|
| 6,787,800 B2 | 9/2004 | Weiland et al. | |
| 7,764,078 B2 * | 7/2010 | Feustel et al. | 324/754.03 |
| 2008/0157075 A1 * | 7/2008 | Feustel et al. | 257/48 |
| 2008/0164468 A1 * | 7/2008 | Chen et al. | 257/48 |
| 2009/0033353 A1 | 2/2009 | Yu et al. | |
| 2012/0068725 A1 * | 3/2012 | Pagani | 324/750.16 |
| 2013/0009656 A1 * | 1/2013 | Wu | 324/755.01 |
| 2014/0059507 A1 * | 2/2014 | Sunter | 716/112 |

FOREIGN PATENT DOCUMENTS

| | | |
|---|---|---|
| JP | 2000250953 A | 9/2000 |
| JP | 2010211342 A | 9/2010 |
| KR | 19990066372 A | 8/1999 |
| KR | 100333368 B1 | 4/2002 |
| KR | 20050101857 A | 10/2005 |
| KR | 101167199 B1 | 7/2012 |

* cited by examiner

*Primary Examiner* — Vuthe Siek
(74) *Attorney, Agent, or Firm* — Harness, Dickey & Pierce, P.L.C.

(57) ABSTRACT

A semiconductor device, a test structure of the semiconductor device, and a method of testing the semiconductor device are provided. The test structure including a first pad and a second pad being separated from each other, and a first test element and a second test element connected between the first pad and the second pad, a first value of a characteristic parameter of the first test element being different from a second value of the characteristic parameter of the second test element, may be provided.

17 Claims, 13 Drawing Sheets

|  | WIDTH | LENGTH | T2T |
|---|---|---|---|
| 221a | W1 | L1 | T1 |
| 221b | W2 | L2 | T2 |
| 221c | W3 | L3 | T3 |
| 221d | W4 | L4 | T4 |

| | NORMAL | RANDOM |
|---|---|---|
| SET | 1DUT =1DOE | 1DUT =30 DOE |
| DUT | 10000 | 10000 |
| DOE | 10000 | 300000 |
| FAIL MODE | 100 | 3000 |
| DETECT | 1% | 1% |
| YIELD | 99% | 70% |

FIG. 10B

| | NORMAL | RANDOM |
|---|---|---|
| SET | 1DUT =1DOE | 1DUT =30 DOE |
| DUT | 10000 | 10000 |
| DOE | 10000 | 300000 |
| FAIL MODE | 10 | 300 |
| DETECT | 0.1% | 0.1% |
| YIELD | 99.9% | 97.0% |

FIG. 10C

|  | NORMAL | RANDOM |
|---|---|---|
| SET | 1DUT<br>=1DOE | 1DUT<br>=30 DOE(MAX) |
| DUT | 10000 | 10000 |
| DOE | 10000 | 300000 |
| FAIL MODE | 10 | 300 |
| DETECT | 0.1% | 0.1% |
| YIELD | 99.9% | 91.0% |

SEMICONDUCTOR DEVICE, TEST STRUCTURE OF THE SEMICONDUCTOR DEVICE, AND METHOD OF TESTING THE SEMICONDUCTOR DEVICE

This application claims priority under 35 U.S.C. §119 to Korean Patent Application No. 10-2013-0125735 filed on Oct. 22, 2013 in the Korean Intellectual Property Office, the disclosure of which is incorporated herein by reference in its entirety.

BACKGROUND

1. Field of the Invention

Example embodiments relate to semiconductor devices, test structures of the semiconductor devices, and/or methods of testing the semiconductor devices.

2. Description of the Related Art

Process simulation is one of the effective ways to optimize a process of fabricating a semiconductor device or establish a design rule of the semiconductor device. As a hardware-based approach in place of or to verify the process simulation, a method of measuring electrical characteristics using a test element group has been suggested. A test element group is generally formed in a scribe line region defined between main chip regions in order to analyze, in various ways, whether a main chip is defective. A test may be conducted after the test element group is loaded on a dedicated test vehicle in order to identify the state of a fabrication facility.

SUMMARY

Some example embodiments provide semiconductor devices which can be tested using various test elements formed in dedicated areas, test structures of the semiconductor devices, and/or methods of testing the semiconductor devices.

Additional example embodiments provide semiconductor devices which can provide product-like test environments using various design of experiments (DOE) environments, test structures of the semiconductor devices, and/or methods of testing the semiconductor devices.

However, example embodiments are not restricted to the example embodiments set forth herein. The above and other aspects of example embodiments will become more apparent to one of ordinary skill in the art to which example embodiments pertains by referring to the detailed description given below.

According to an example embodiment, a test structure of a semiconductor device may include a first pad and a second pad being separate from each other, and a first test element and a second test element connected between the first pad and the second pad. A first value of a characteristic parameter of the first test element may be different from a second value of the characteristic parameter of the second test element.

According to another example embodiment, a test structure of a semiconductor device may include a plurality of pads being separate from each other, and a first test element and a second test element connected between the plurality of pads. The first test element and the second test element may be configured to have different designs of experiments (DOEs).

According to still another example embodiment, a semiconductor device may include a plurality of main chip regions in each of which a main chip is formed, and a scribe line region defined between the main chip regions, and at least one test structure provided in the scribe line region may be formed. The at least one test structure may include a first pad and a second pad being separate from each other, and a first test element and a second test element connected between the first pad and the second pad. A first value of a characteristic parameter of the first test element may be different from a second value of the characteristic parameter of the second test element.

According to yet another example embodiment, a method of testing a semiconductor device may include preparing a test structure of a semiconductor device, the test structure including a first pad pair, a first test element group having a plurality of test elements connected between the first pad pair, a second pad pair being separate from the first pad pair, and a second test element group having a plurality of test elements connected between the second pad pair, the test elements of the first test element group having different values of a characteristic parameters, respectively, testing the semiconductor device by transmitting electrical signals to the first pad pair and the second pad pair, classifying the test elements of the first test element group and the second test element group into a plurality of test value groups based on the test result, and analyzing a fail mode using relevance among the plurality of test value groups.

BRIEF DESCRIPTION OF THE DRAWINGS

The above and other aspects and features of example embodiments will become more apparent by describing in detail some example embodiments thereof with reference to the attached drawings, in which.

DETAILED DESCRIPTION OF EXAMPLE EMBODIMENTS

Various example embodiments will now be described more fully hereinafter with reference to the accompanying drawings, in which some example embodiments are shown. This present disclosure may, however, be embodied in different forms and should not be construed as limited to the example embodiments set forth herein. Rather, these example embodiments are provided so that this disclosure will be thorough and complete, and will fully convey the scope of example embodiments to those skilled in the art. Like reference numbers indicate like components throughout the specification. In the attached figures, the thickness of layers and regions is exaggerated for clarity.

It will also be understood that when a layer is referred to as being "on," "connected to," or "coupled to" another layer or substrate, it can be directly on, connected or coupled to the other layer or substrate, or intervening layers may also be present. In contrast, when an element is referred to as being "directly on," "directly connected to," or "directly coupled to" another element, there are no intervening elements present. The term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which example embodiments belong. It is noted that the use of any and all examples, or example terms provided herein is intended merely to better illuminate the example embodiments and is not a limitation on the scope of example embodiments unless otherwise specified. Further, unless defined otherwise, all terms defined in generally used dictionaries may not be overly interpreted.

Example embodiments will be described with reference to perspective views, cross-sectional views, and/or plan views, in which some example embodiments are shown. Thus, the profile of an example view may be modified according to manufacturing techniques and/or allowances. That is, the example embodiments described herein are not intended to limit the scope of example embodiments, but cover all changes and modifications that can be caused due to a change in manufacturing process. Thus, regions shown in the drawings are illustrated in schematic form and the shapes of the regions are presented simply by way of illustration and not as a limitation.

Hereinafter, some example embodiments will be explained in further detail with reference to the accompanying drawings.

Figure 1:
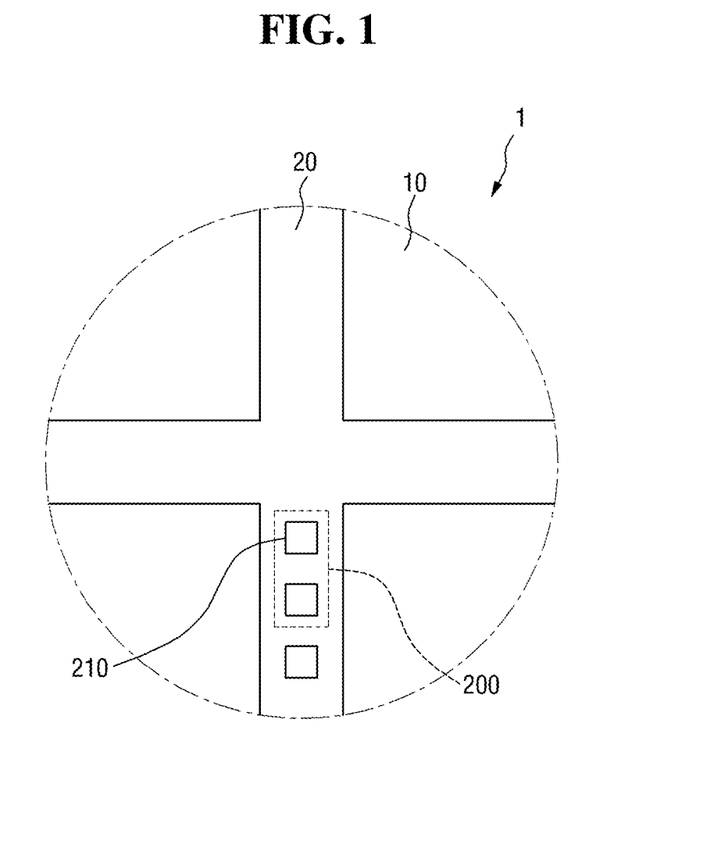
FIG. 1 is a diagram illustrating a semiconductor device according to an example embodiment.

FIG. 1 is a diagram illustrating a semiconductor device according to an example embodiment.

Referring to FIG. 1, a semiconductor device 1 according to the current example embodiment includes a plurality of main chip regions 10 and a scribe line region 20.

The main chip regions 10 may be separated from each other. For example, the main chip regions 10 may be arranged to form an array. However, example embodiments are not limited thereto, and the main chip regions 10 may be arranged side by side in a direction. A main chip (not shown) may be formed by the main chip regions 10. The main chip may include circuit elements, for example, a plurality of transistors, capacitors, and/or resistors.

The scribe line region 20 may be defined between the main chip regions 10. For example, the scribe line region 20 may be provided in an empty space between the main chip regions 10. The scribe line region 20 may be used as a cutting region for separating the main chip regions from each other. At least one test structure 200 may be formed in the scribe line region 20. The test structure 200 may include pads 210 for receiving and/or transmitting electrical signals (e.g., voltages or currents).

Unlike the illustration of FIG. 1, at least one test structure 200 may be formed in at least one of the main chip regions 10. According to another example embodiment, at least one test structure 200 may be formed to partially overlap the main chip regions 10 and the scribe line region 20.

Figure 2A:
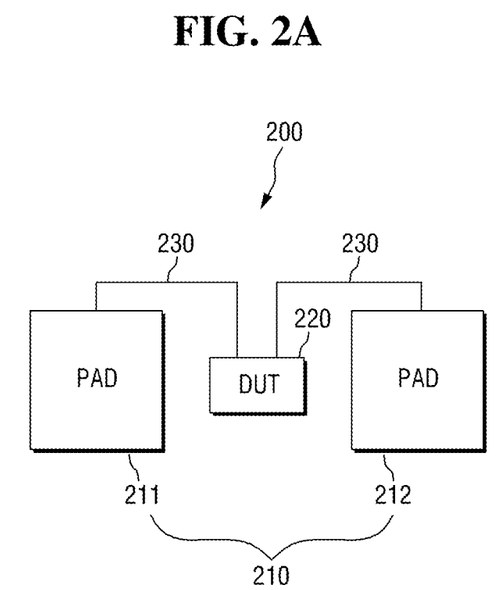
FIG. 2A is a diagram illustrating a test structure of the semiconductor device of FIG. 1.

FIG. 2A is a diagram illustrating a test structure of the semiconductor device of FIG. 1.

Referring to FIG. 2A, a test structure 200 of the semiconductor device 1 includes the pads 210 and a device under test (DUT) 220.

The pads 210 may include a first pad 211 and a second pad 212, which are separated from each other. For example, the first pad 211 may function as an input pad which receives an electrical signal, and the second pad 212 may function as an output pad which outputs an electrical signal. The first and second pads 211 and 212 may be formed of, but not limited to, a conductive material, for example, metal.

The DUT 220 may be connected between the first pad 211 and the second pad 212. The DUT 220 may be electrically connected to the first pad 211 and the second pad 212 by connection wirings 230, respectively. The connection wirings 230 may be formed of, but not limited to, a conductive material, for example, metal or polysilicon. Although not illustrated specifically, the connection wirings 230 may have a single layer wiring structure or a multilayer wiring structure.

As will be described later, the DUT 220 may include a plurality of test elements. For example, the test elements may be, but are not limited to, a combination of a plurality of transistors, capacitors, or resistors or a combination of a plurality of patterns. The test elements may also be referred to as measuring elements. The DUT 220 may be disposed at the same or at different level from the first and second pads 211 and 212.

During a process of testing the semiconductor device 1, a probe may be connected to each of the first pad 211 (e.g., an input pad) and the second pad 212 (e.g., an output pad). An electrical signal input to the first pad 211 (e.g., the input pad) may be output to the second pad 212 (e.g., the output pad) via the DUT 220. The electrical signal output to the second pad 212 (e.g., the output pad) may be analyzed to measure electrical characteristics of the DUT 220. For example, when the output electrical signal falls outside a desired (or alternatively, predetermined) range, a main chip may be determined to be defective.

The DUT 220 of the semiconductor device 1 may be formed using the same process as a process of forming the main chip. Therefore, measuring electrical characteristics of the DUT 220 can be equated with measuring electrical characteristics of the main chip. Accordingly, whether the main chip is defective can be inferred from the electrical characteristics of the DUT 220.

Figure 2B:
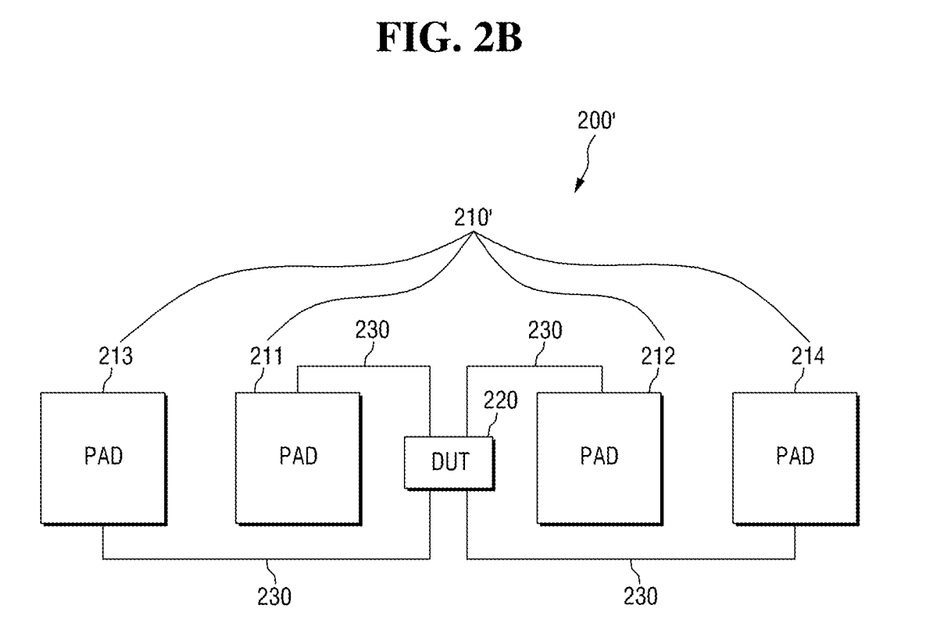
FIG. 2B is a diagram illustrating an application example of the test structure of the semiconductor device shown in FIG. 1.

FIG. 2B is a diagram illustrating an application example of the test structure of the semiconductor device shown in FIG. 1.

Referring to FIG. 2B, an application example 200' of the test structure 200 of the semiconductor device 1 includes a plurality of pads 210' and a DUT 220.

The pads 210' may include a first pad 211, a second pad 212, a third pad 213, and a fourth pad 214. For example, the first pad 211 and the third pad 213 may function as input pads which receive electrical signals, and the second pad 212 and the fourth pad 214 may function as output pads which output electrical signals. According to an example embodiment, the first pad 211 and the fourth pad 214 may function as input pads which receive electrical signals, and the second pad 212 and the third pad 213 may function as output pads which output electrical signals. The first through fourth pads 211 through 214 may be formed of, but not limited to, a conductive material, for example, metal.

The DUT 220 may be connected between the first pad 211 and the second pad 212. Further, the DUT 220 may be connected between the third pad 213 and the fourth pad 214. The first pad 211 and the third pad 213 may be disposed on a side of the DUT 220, and the second pad 212 and the fourth pad 214 may be disposed on the other side of the DUT 220. The DUT 220 may be electrically connected to the first pad 211, the second pad 212, the third pad 213, and the fourth pad 214 by connection wirings 230. The connection wirings 230 may be formed of, but not limited to, a conductive material, for example, metal or polysilicon. Although not illustrated specifically, the connection wirings 230 may have a single layer wiring structure or a multilayer wiring structure.

As will be described later, the DUT 220 may include a plurality of test elements. For example, the test elements may be, but are not limited to, a combination of a plurality of transistors, capacitors, resistors, and/or a combination of a plurality of patterns. The test elements may also be referred to as measuring elements. The DUT 220 may be disposed at the same level or at different level from the first through fourth pads 211 through 214.

Figure 3A:
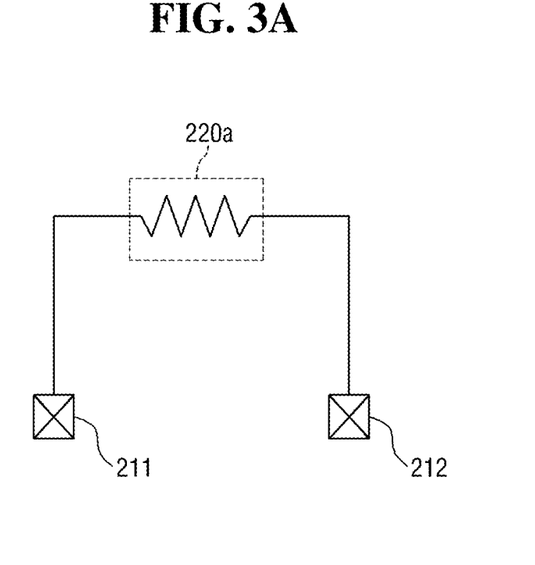
FIG. 3A is a diagram illustrating a first example of a device under test (DUT) shown in FIGS. 2A and 2B.

FIG. 3A is a diagram illustrating a first example of the DUT shown in FIGS. 2A and 2B.

Referring to FIG. 3A, as the first example, a DUT 220*a* may have a single via-chain structure. According to this example embodiment, test elements of the DUT 220*a* may form the via-chain structure. An end of the via-chain structure may be electrically connected to a first pad 211, and the other end of the via-chain structure may be electrically connected to a second pad 212. Whether the DUT 220*a* is an open circuit can be verified using the single via-chain structure.

Figure 3B:
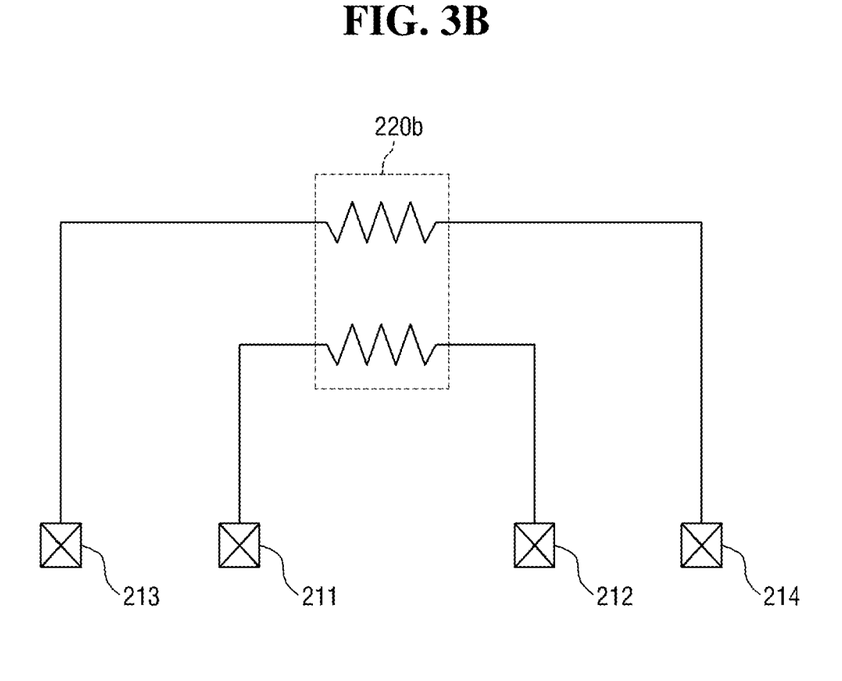
FIG. 3B is a diagram illustrating a second example of the DUT shown in FIGS. 2A and 2B.

FIG. 3B is a diagram illustrating a second example of the DUT shown in FIGS. 2A and 2B.

Referring to FIG. 3B, as the second example, a DUT 220*b* may have a double via-chain structure. According to this example embodiment, test elements of the DUT 220*b* may form a plurality of via-chain structures. For example, the test elements of the DUT 220*b* may form a plurality of via-chain structures. The test elements of the DUT 220*b* may intersect with each other. An end of one via-chain structure may be electrically connected to a first pad 211, and the other end of the via-chain structure may be electrically connected to a second pad 212. An end of another via-chain structure may be electrically connected to a third pad 213, and the other end of the another via-chain structure may be electrically connected to a fourth pad 214. Whether the DUT 220*b* is an open circuit or a short circuit can be verified using the double via-chain structure.

Figure 3C:
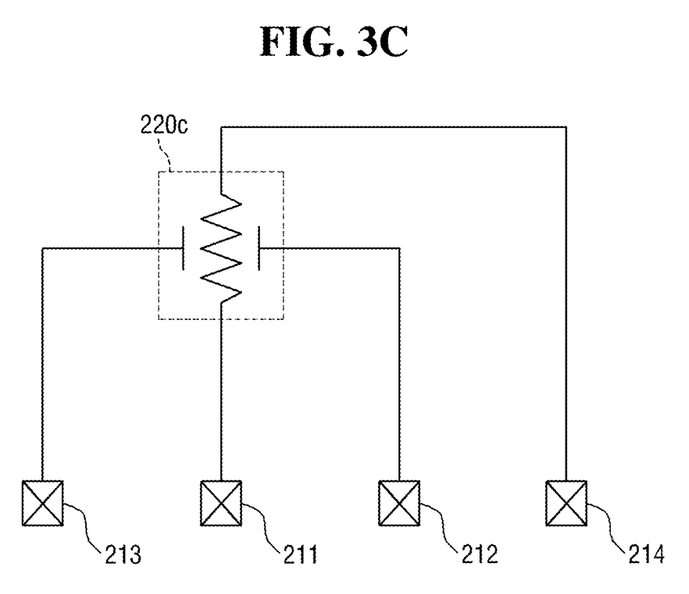
FIG. 3C is a diagram illustrating a third example of the DUT shown in FIGS. 2A and 2B.

FIG. 3C is a diagram illustrating a third example of the DUT shown in FIGS. 2A and 2B.

Referring to FIG. 3C, as a third example, a DUT 220*c* may have a snake-comb structure. According to this example embodiment, test elements of the DUT 220*c* may have a single snake structure and a plurality of comb structures. An end of the snake structure may be electrically connected to a first pad 211, and the other end of the snake structure may be electrically connected to a fourth pad 214. An end of one comb structure may be electrically connected to a third pad 213, and an end of another comb structure may be electrically connected to a second pad 212. Whether the DUT 220*c* is an open circuit can be verified using the snake structure, and whether the DUT 220*c* is a short circuit can be verified using the comb structures.

Although not shown specifically, the DUT 220 may have different structures from the structures shown in FIGS. 3A through 3C. Further, the DUT 220 may include dummy patterns in addition to the test elements for analyzing whether a main chip is defective.

Figure 4:
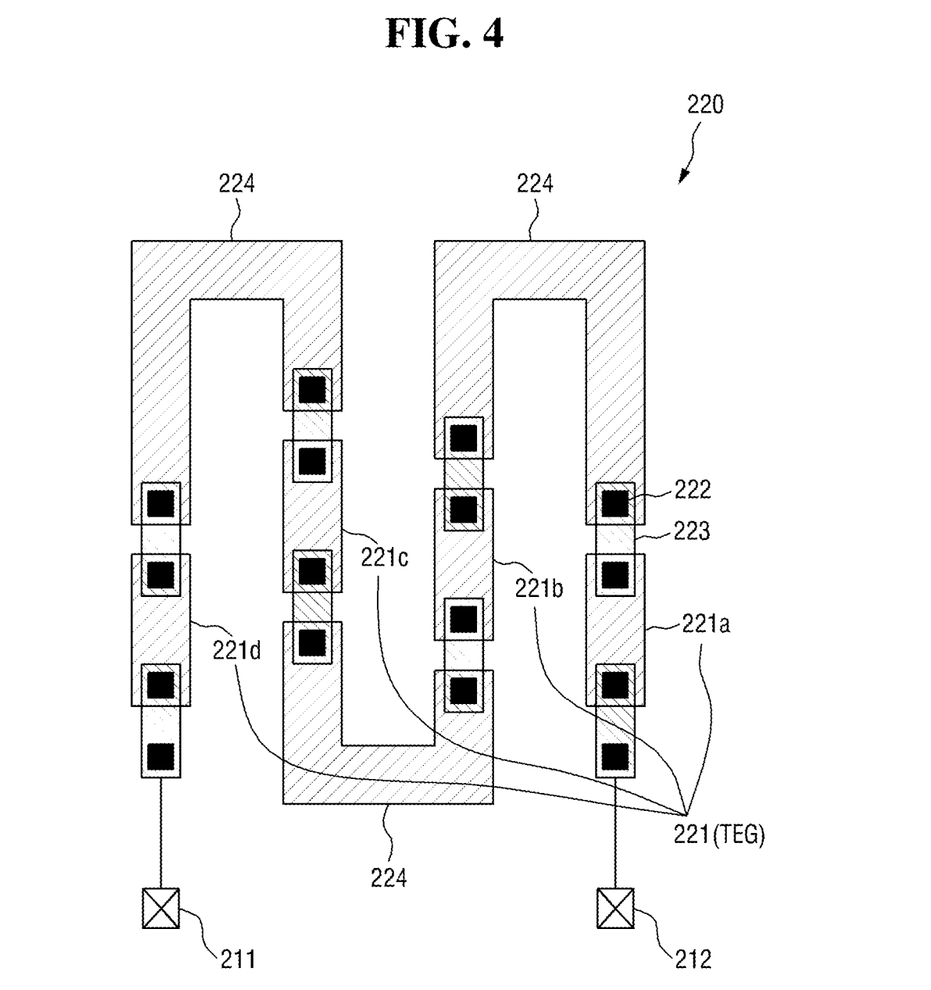
FIG. 4 is a diagram illustrating an example of a test element group of the DUT shown in FIGS. 2A and 2B.
Figure 5:
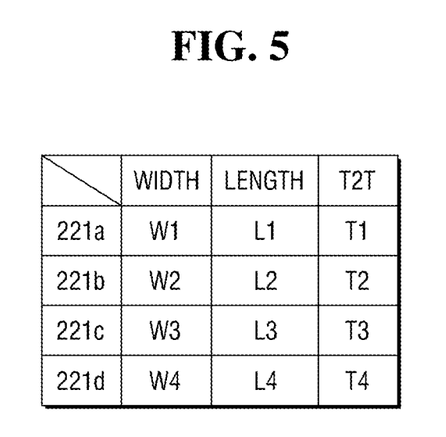
FIG. 5 is a table showing parameters of the test element group of FIG. 4.

FIG. 4 is a diagram illustrating an example of a test element group of the DUT shown in FIGS. 2A and 2B. FIG. 5 is a table showing parameters of the test element group of FIG. 4.

Referring to FIG. 4, a DUT 220 includes a plurality of test elements (TEG) 221. For example, the test elements 221 may include a first test element 221*a*, a second test element 221*b*, a third test element 221*c*, and a fourth test element 221*d*. The test elements 221 may form one test element group.

A case where the test elements 221 form a single via-chain structure will hereinafter be described. The test elements 221 may be embodied as, for example, a single layer via-chain or a multilayer via-chain structure.

The test elements 221 may be formed of a conductive material, for example, metal. The test elements 221 may be connected to first connection patterns 223 by vias 222. The test elements 221 (e.g., 221*a* through 221*d*) may be disposed, for example, at the same or at different levels.

The vias 222 may be disposed on both sides (e.g., in FIG. 4, upper and lower sides) of each of the test elements 221. The vias 222 may be formed of, but not limited to, a conductive material, for example, polysilicon.

The first connection patterns 223 may be formed of the same material as or different material from the test elements 221. The first connection patterns 223 may be disposed at a different level from the test elements 221. For example, the first connection patterns 223 may be disposed at a level lower or higher than the test elements 221. The vias 222 may also be disposed on both sides of each of the first connection patterns 223. The first connection patterns 223 may be connected to the test elements 221 and second connection patterns 224 through the vias 222.

The second connection patterns 224 may be formed of the same material as or different material from the test elements 221. The second connection patterns 224 may be bent to form a via-chain structure, but example embodiments are not limited thereto. The second connection patterns 224 may be disposed at the same level as the test elements 221. According to an example embodiment, the second connection patterns 224 may be disposed in a multilayer structure. The vias 222 may also be disposed on both sides of each of the second connection patterns 224.

Although not shown specifically, each of the first connection patterns 223 may be connected between one test element 221 and another test element 221. That is, the test elements 221 may be connected side by side in a direction. The number of test elements connected side by side in each column may be the same or different from the number of test elements connected side by side in another column.

The first test element 221, the second test element 221b, the third test element 221c and the fourth test element 221d that constitute one test element group may provide different designs of experiments (DOEs). A DOE may correspond to a shape or disposition of each of the test elements 221. The shape or disposition of each of the test elements 221 may be defined by characteristic parameters which will be described later.

Referring to FIG. 5, the test elements 221 may have different values of characteristic parameters. For example, the first test element 221a, the second test element 221b, the third test element 221c, and the fourth test element 221d may have different values of characteristic parameters (e.g., width, length, and thing to thing (T2T) distance). For example, "W1 through W4" may be different, "L1 through L4" may be different, and "T1 through T4" may be different.

For example, some of the test elements 221 may have same values for some characteristic parameters. For example, "W1" and "W2" may be equal.

For example, some of the test elements 221 may have the same values for all characteristic parameters. For example, "W1" may be equal to "W2," "L1" may be equal to "L2," and "T1" may be equal to "T2."

However, values of characteristic parameters of each of the test elements 221 may be selected such that not all shapes or dispositions of the test elements 221 constituting one test element group are identical. To this end, randomized values may be selected as the values of the characteristic parameters. For example, desired (or alternatively, predetermined) values may be selected as the values of the characteristic parameters. For example, statistically meaningful values or experimental values obtained by a Taguchi method may be selected as the values of the characteristic parameters.

Figure 6:
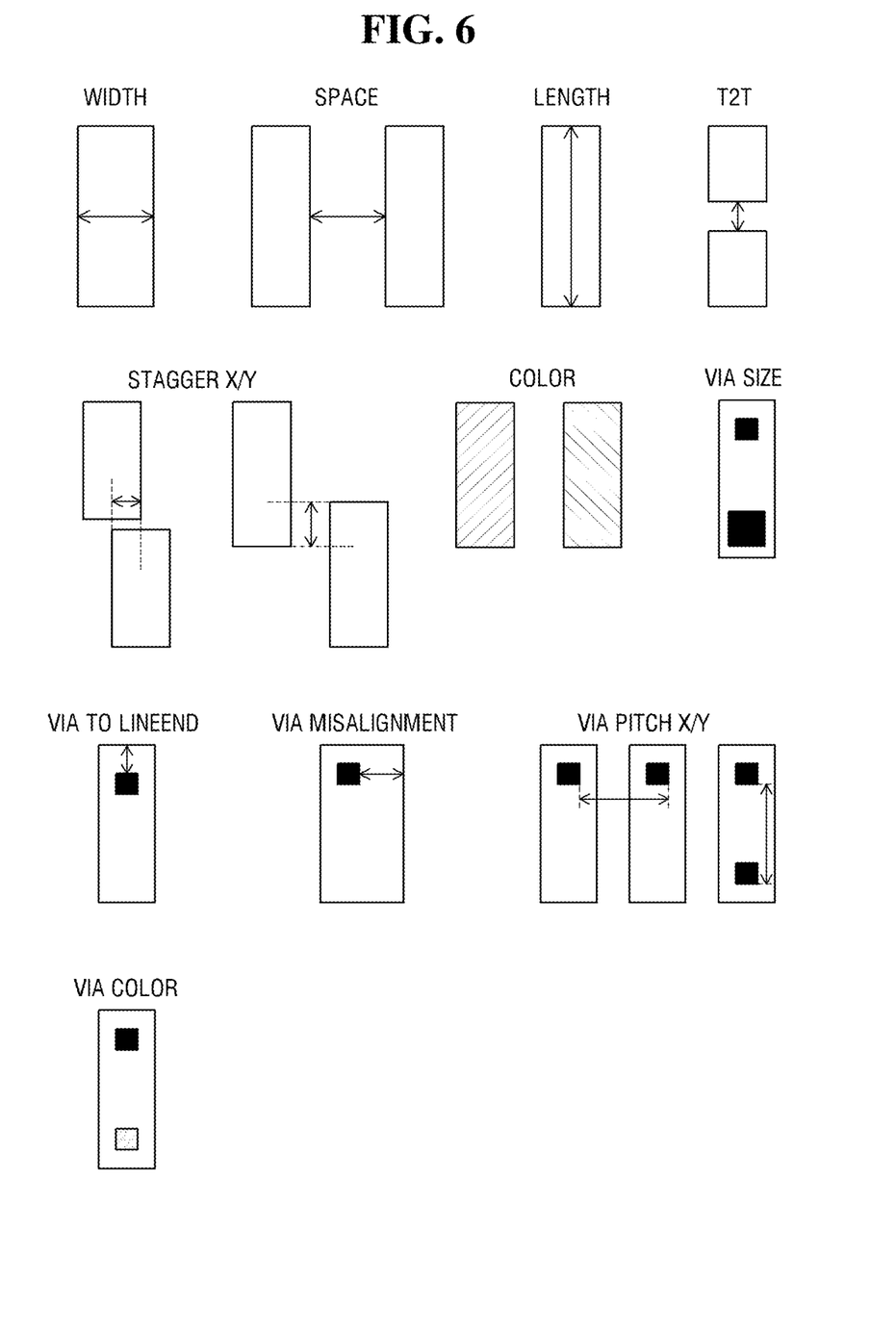
FIG. 6 is a diagram illustrating characteristic parameters of a test element.

FIG. 6 is a diagram illustrating characteristic parameters of a test element.

Referring to FIG. 6, characteristic parameters of the test element may include, for example, at least one of a width, a space, a length, a T2T distance, a stagger, a line color, a via size, a via to line end distance, a via misalignment, a via pitch, and/a via color.

However, example embodiments are not limited thereto. The characteristic parameters of the test element may include various additional parameters to define the shapes or disposition of the test element.

Figure 7A:
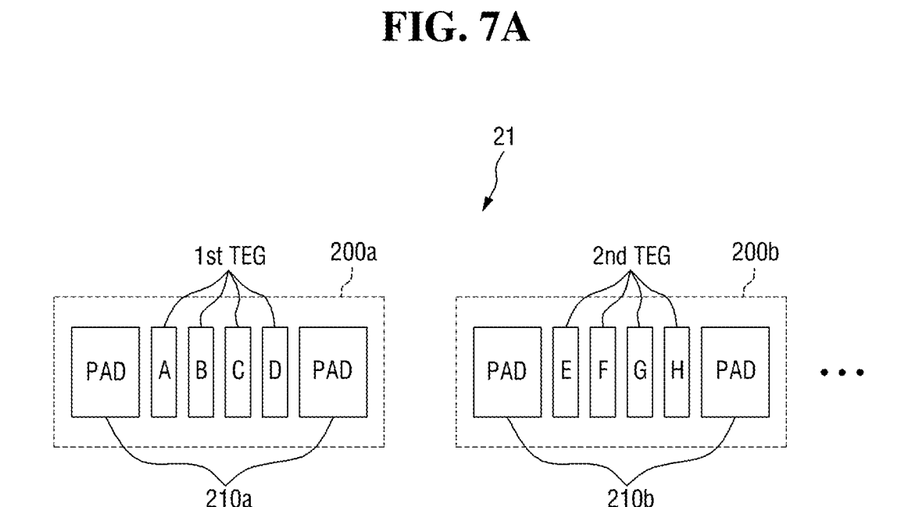
FIG. 7A is a diagram illustrating a test module according to an example embodiment.

FIG. 7A is a diagram illustrating a test module according to an example embodiment.

Referring to FIG. 7A, a test module 21 according to this example embodiment may include a plurality of test structures. The test structures may include a first test structure 200a and a second test structure 200b.

The first test structure 200a may include a first pad pair 210a and a first test element group $1^{st}$ TEG, and the second test structure 200b may include a second pad pair 210b and a second test element group $2^{nd}$ TEG.

Each of the first pad pair 210a and the second pad pair 210b may include a plurality of pads which are separated from each other. Each of the pads may function as an input pad which receives an electrical signal or an output pad which outputs an electrical signal. The first test element group $1^{st}$ TEG may include a plurality of test elements connected between the first pad pair 210a, and the second test element group $2^{nd}$ TEG may include a plurality of test elements connected between the second pad pair 210b.

In FIG. 7A, "A through H" may indicate test elements having different values (e.g., shapes or dispositions) for at least one characteristic parameter.

In the test module 21 according to this example embodiment, the test elements of the first test element group $1^{st}$ TEG may have different values of characteristic parameter(s). The test elements of the second test element group $2^{nd}$ TEG may also have different values of the characteristic parameter(s). The test elements of the first test element group $1^{st}$ TEG may be different from the test elements of the second test element group $2^{nd}$ TEG. The test module 21 configured as described above may also be defined as an independent test module.

Figure 7B:
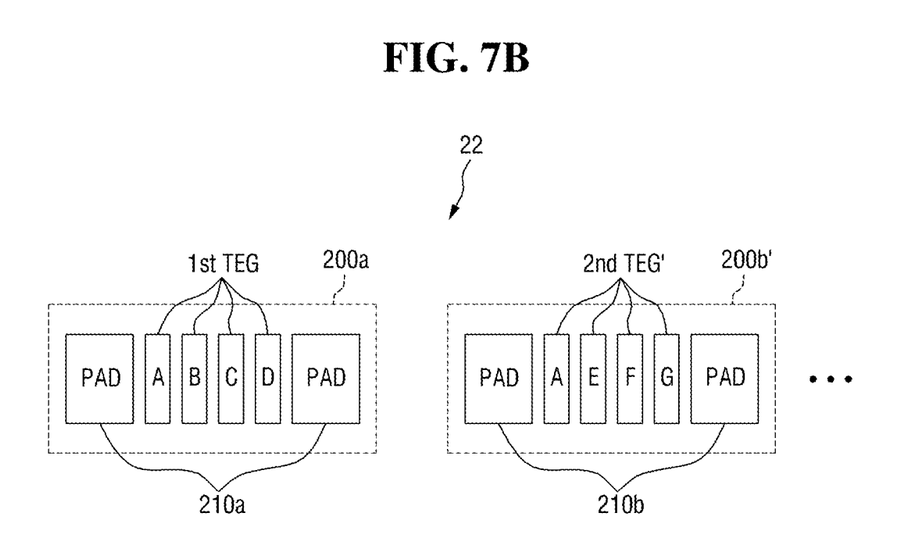
FIG. 7B is a diagram illustrating a test module according to another example embodiment.

FIG. 7B is a diagram illustrating a test module according to another example embodiment.

Referring to FIG. 7B, a test module 22 according to this example embodiment may include a plurality of test structures. The test structures may include a first test structure 200a and a second test structure 200b'.

The first test structure 200a may include a first pad pair 210a and a first test element group $1^{st}$ TEG, and the second test structure 200b' may include a second pad pair 210b and a second test element group $2^{nd}$ TEG'.

Each of the first pad pair 210a and the second pad pair 210b may include a plurality of pads which are separated from each other. Each of the pads may function as an input pad which receives an electrical signal or an output pad which outputs an electrical signal. The first test element group $1^{st}$ TEG may include a plurality of test elements connected between the first pad pair 210a, and the second test element group $2^{nd}$ TEG' may include a plurality of test elements connected between the second pad pair 210b.

In the test module 22 according to this example embodiment, at least one of the test elements of the first test element group $1^{st}$ TEG may be identical to at least one of the test elements of the second test element group $2^{nd}$ TEG'. For example, the first test element group $1^{st}$ TEG and the second test element group $2^{nd}$ TEG' may respectively include test elements "A" having the same shape and disposition. The test module 22 configured as described above may also be defined as a combination test module.

In FIGS. 7A and 7B, each of the test modules 21 and 22 includes two test structures. However, example embodiments are not limited thereto, and each of the test modules 21 and 22 may also include three or more test structures.

Figure 8:
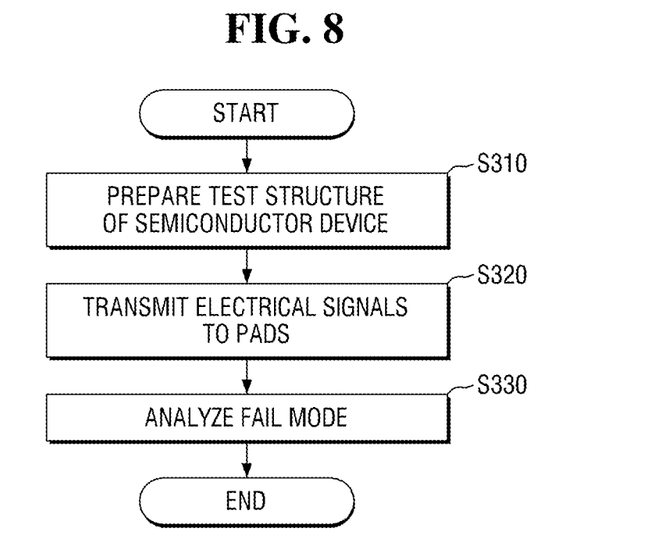
FIG. 8 is a flowchart illustrating a method of testing a semiconductor device according to an example embodiment.

FIG. 8 is a flowchart illustrating a method of testing a semiconductor device according to an example embodiment.

Referring to FIG. 8, in a method of testing a semiconductor device according to this example embodiment, a test module (which includes test of a semiconductor device may be prepared (operation S310). As described above, the test module of the semiconductor device may include a first pad pair, a first test element group which includes a plurality of test elements connected between the first pad pair, a second pad pair which is separated from the first pad pair, and a second test element group which includes a plurality of test elements connected between the second pad pair. The test elements of the first test element group may have different values of characteristic parameter(s).

Electrical signals may be transmitted to the first pad pair and the second pad pair to test the semiconductor device (operation S320).

Then, a fail mode may be analyzed based on the test result (operation S330).

A statistical analysis algorithm may be used to analyze the fail mode because each test element group of the test module of the semiconductor device may include a plurality of test elements having different values of characteristic parameter(s). If the fail mode is analyzed intuitively (without using the statistical analysis algorithm, it may be difficult to determine which of the test elements having different shapes and dispositions, is in the fail mode. By contrast, If the statistical analysis algorithm is used, the test elements of the first test element group and the second test element group may be classified into a plurality of groups (e.g., a pass group and a fail group), and the fail mode may be determined with relative ease using relevance between the pass group and the fail group.

The test elements may be classified into a plurality of groups using, for example, at least one of a cluster analysis algorithm, an analysis of variance (ANOVA) algorithm, and a regression analysis algorithm as the statistical analysis algorithm. For example, at least one of a k-means algorithm, the ANOVA algorithm, or a Kruskal-Wallis algorithm can be used. However, example embodiments are not limited thereto. When the statistical analysis algorithm is used, each test element may be provided as an object, or characteristic parameters of each test element may be provided as variables.

When the fail mode analysis result indicates that design rule check (DRC) clean is required, randomly generated values of the test elements may be randomly generated again, and then DRC clean may be performed. This is because if the values of the test elements are generated randomly, it is realistically difficult to perform DRC clean using a person's cognitive capability.

Figure 9:
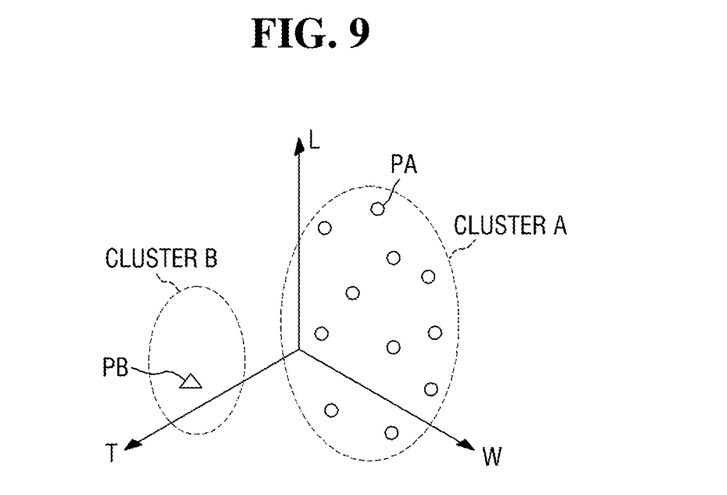
FIG. 9 is a diagram illustrating a method of analyzing a fail mode using a k-means algorithm.

FIG. 9 is a diagram illustrating a method of analyzing a fail mode using a k-means algorithm. In FIG. 9, each axis may represent values of a characteristic parameter (e.g., a width, a length, and a T2T distance).

Referring to FIG. 9, a plurality of test elements may be mapped to a plurality of points PA and PB having values of characteristic parameters as their coordinates. The points PA and PB may be classified into a first cluster CLUSTER A and a second cluster CLUSTER B by using the k-means algorithm. For example, the first cluster CLUSTER A may correspond to a pass group, and the second cluster CLUSTER B may correspond to a fail group. In this example embodiment, values of a characteristic parameter that divides the first cluster CLUSTER A and the second cluster CLUSTER B may be determined as a fail mode.

Figure 10A:
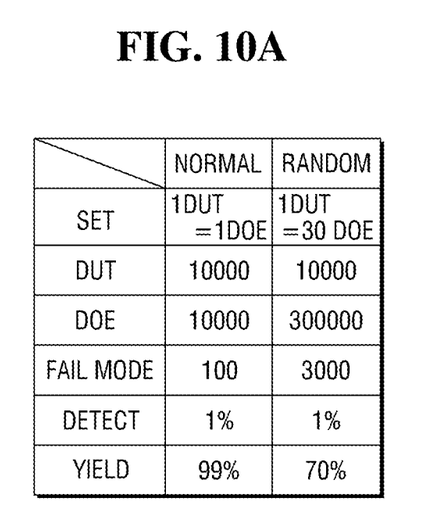
FIGS. 10A through 10C are tables showing results of analysis using the test method of FIG. 8.
Figure 10B:
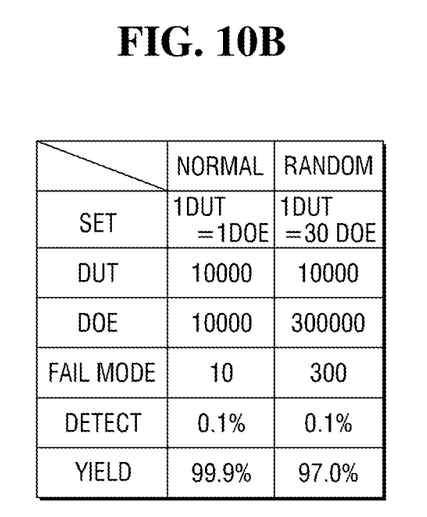
Figure 10C:
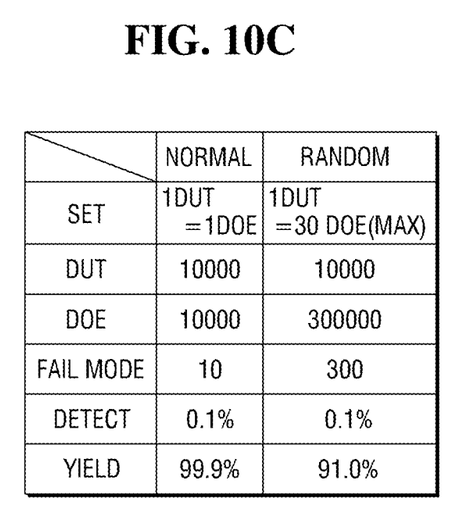

FIGS. 10A through 10C are tables showing results of analysis using the test method of FIG. 8.

FIG. 10A illustrates a semiconductor device development stage with a relatively low yield of, e.g., 99%.

Referring to FIG. 10A, in a normal case, one DUT provides one DOE. According to this example embodiment, test elements of one DUT may have the same shape and disposition. For example, when 10,000 DUTs are tested, 100 DUTs out of the 10,000 DUTs may be detected as in a fail mode (Likewise, when 30,000 DUTs are tested, 3,000 DUTs may be detected as in the fail mode). Accordingly, a fail mode detection rate may be 1%, and a yield may be 99%.

Randomized values may be selected as characteristic parameters of test elements of DUTs, and one DUT may provide 30 DOEs. In this case, when 10,000 DUTs are tested, 300,000 DOEs can be tested. It should be noted that even if any one of 30 test elements of a DUT is in the fail mode, electrical characteristics of the DUT can be defective.

Therefore, in the best-case scenario where 3,000 test elements in the fail mode are included in 100 DUTs, the yield may be calculated to be 99% (100/10,000). However, in the worst-case scenario where 3,000 test elements in the fail mode are included in different DUTs, respectively, the yield may be calculated to be 70% (3000/10000).

FIG. 10B illustrates a semiconductor device mass-production stage with a relatively high yield of, e.g., 99.9%.

Referring to FIG. 10B, in a normal case, when 10,000 DUTs are tested, 10 DUTs out of the 10,000 DUTs may be detected as in a fail mode (Likewise, when 30,000 DUTs are tested, 30 DUTs may be detected as in the fail mode). Accordingly, a fail mode detection rate may be 0.1%, and a yield may be 99.9%.

Randomized values may be selected as characteristic parameters of test elements of DUTs, and one DUT may provide 30 DOEs. In this case, when 10,000 DUTs are tested, 300,000 DOEs can be tested. It should be noted that even if any one of 30 test elements of a DUT is in the fail mode, electrical characteristics of the DUT can be defective.

Therefore, in the best-case scenario where 300 test elements in the fail mode are included in 10 DUTs, the yield may be calculated to be 99.9% (10/10,000). However, in the worst-case scenario where 300 test elements in the fail mode are included in different DUTs, respectively, the yield may be calculated to be 97.0% (300/10,000).

FIG. 10C illustrates a case where different DUTs include the same test element.

Referring to FIG. 10C, randomized values may be selected as characteristic parameters of test elements of DUTs, and the DUTs may be generated such that 300,000 DOEs can be tested. In this case, one DUT may include 90 test elements and may provide a maximum of 30 DOEs. In the entire test module, one test element may be repeated three times. It should be noted that even if any one of the 90 test elements of a DUT is in a fail mode, electrical characteristics of the DUT can be defective.

Therefore, in the best-case scenario where 900 test elements in the fail mode are included in 10 DUTs, a yield may be calculated to be 99.9% (100/10,000). However, in the worst-case scenario where 900 test elements in the fail mode are included in different DUTs, respectively, the yield may be calculated to be 91.0% (900/10,000).

When the above-described method of testing a semiconductor device is used, a product-like environment can be provided using various DOE environments. Therefore, the fail mode can be detected more precisely than when a test is conducted using a repetitive and standardized test element group.

In concluding the detailed description, those skilled in the art will appreciate that many variations and modifications can be made to the foregoing example embodiments without substantially departing from the principles of example embodiments. Therefore, the disclosed example embodiments are used in a generic and descriptive sense only and not for purposes of limitation.

What is claimed is:

1. A test structure of a semiconductor device, the test structure comprising:
a first pad and a second pad separate from each other; and
a first test element and a second test element connected between the first pad and the second pad, a first value of a characteristic parameter of the first test element being different from a second value of the characteristic parameter of the second test element, wherein the first and second values are random values selected by an algorithm, which is configured to generate the random values in a statistically meaningful manner, or based on experimental values obtained by a design of experiments (DOEs).

2. The test structure of claim 1, wherein the characteristic parameter includes one of shapes and dispositions of the first test element and the second test element.

3. The test structure of claim 1, wherein the first test element and the second test element form one test element group.

4. The test structure of claim 1, wherein the characteristic parameter includes at least one of a width, a space, a length, a thing to thing (T2T) distance, a stagger, a line color, a via size, a via to line end distance, a via misalignment, a via pitch, and a via color.

5. The test structure of claim 1, wherein the first test element is connected to a connection pattern by a first via, and the second test element is connected to the connection pattern by a second via different from the first via.

6. The test structure of claim 1, wherein the first and second pads and the first and second test elements are disposed on a scribe line.

7. A test structure of a semiconductor device, the test structure comprising:
a plurality of pads separate from each other; and
a first test element and a second test element connected between the plurality of pads, the first test element and the second test element configured to have different designs of experiments (DOEs),
wherein a first value of a first characteristic parameter of the first test element is different from a second value of the first characteristic parameter of the second test element, and the first and second values are first random values selected by an algorithm, which is configured to generate the first random values in a statistically meaningful manner, or based on experimental values obtained by a design of experiments (DOEs).

8. The test structure of claim 7, wherein the experimental values obtained by the DOEs correspond to shapes or dispositions of the first and second test elements, respectively.

9. The test structure of claim 7, wherein a third value of a second characteristic parameter of the first test element is equal to a fourth value of the second characteristic parameter of the second test element, wherein the second characteristic parameter is different from the first characteristic parameter.

10. The test structure of claim 9, wherein each of the first and second characteristic parameters includes at least one of a width, a space, a length, a T2T distance, a stagger, a line color, a via size, a via to line end distance, a via misalignment, a via pitch, and a via color.

11. The test structure of claim 9, wherein the third and fourth values are second random values selected by an algorithm, which is configured to generate the second random values in a statistically meaningful manner, or based on second experimental values obtained by a design of experiments (DOEs).

12. The test structure of claim 7, wherein the first test element and the second test element are provided in a via-chain structure.

13. The test structure of claim 7, wherein the first test element and the second test element are provided in a snake-comb structure.

14. A test structure of a semiconductor device comprising:
a test module including a first test structure and a second test structure, the first test structure including a first test element group and the second test structure including a second test element group, the first test element group including a plurality of first test elements, the second test element group including a plurality of second test elements, and the first test elements having first different characteristic parameters, respectively, and the second test elements having second different characteristic parameters, respectively,
wherein the first and second different characteristic parameters are random values selected by an algorithm, which is configured to generate the random values in a statistically meaningful manner, or based on experimental values obtained by a design of experiments (DOES).

15. The test structure of claim 14, wherein at least one of second different characteristic parameters is configured to be equal to at least one of the first different characteristic parameters.

16. The test structure of claim 14, wherein the first test elements and the second test elements are configured to represent different DOEs, respectively.

17. The test structure of claim 14, wherein the first test elements are configured to represent a first set of different DOEs and the second test elements are configured to represent a second set of different DOEs, and at least one of the first set of different DOEs is configured to a same value as at least one of the second set of DOEs.

* * * * *